US006635537B2

(12) United States Patent
Lee et al.

(10) Patent No.: US 6,635,537 B2
(45) Date of Patent: Oct. 21, 2003

(54) METHOD OF FABRICATING GATE OXIDE

(75) Inventors: Tong-Hsin Lee, Taipei Hsien (TW);
Shih-Chien Hsu, Taiepi (TW);
Chang-Chi Huang, Miaoli (TW);
Cheng-Tung Huang, Kaohsiung (TW);
Sheng-Hao Lin, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 171 days.

(21) Appl. No.: 09/828,544

(22) Filed: Apr. 6, 2001

(65) Prior Publication Data

US 2002/0146890 A1 Oct. 10, 2002

(51) Int. Cl.[7] .................. H01L 21/336; H01L 21/8328; H01L 21/76; H01L 21/3205; H01L 21/4763
(52) U.S. Cl. ........................ 438/289; 438/217; 438/296; 438/426; 438/433; 438/591; 257/333; 257/523
(58) Field of Search ................................. 438/424, 425, 438/426, 591, 216, 287, 296, 298, 423, 433, 217, 289; 257/333, 523, 411, 639, 647

(56) References Cited

U.S. PATENT DOCUMENTS 6,002,160 A * 12/1999 He et al. .................... 257/513
6,323,106 B1 * 11/2001 Huang et al. ............... 438/433
6,413,826 B2 * 7/2002 Kim ........................... 438/287

\* cited by examiner

Primary Examiner—Olik Chaudhurl
Assistant Examiner—Neal Berezny
(74) Attorney, Agent, or Firm—J. C. Patents

(57) ABSTRACT

A method of fabricating a gate oxide layer. A mask layer isformed on a substrate. The mask layer and the substrate are patterned to form a trench in the substrate. A portion of the mask layer is removed to expose the substrate at a top edge corner portion of the trench. An insulation layer is formed to fill the trench and covering the exposed substrate and the remaining mask layer. The insulation layer over the remaining mask layer is removed to expose the mask layer. The remaining mask layer is removed to expose the substrate. The exposed substrate is implanted with ions to reduce the oxidation rate. As a result, the substrate at the top edge corner portion of the trench covered with the insulation layer has an oxidation rate higher than the exposed substrate. The insulation layer over the surface level of the substrate is then removed to expose the substrate at the top edge corner portion of the trench. A gate oxide is formed on the substrate with a thickness larger at the top edge corner of the trench than elsewhere.

19 Claims, 4 Drawing Sheets

METHOD OF FABRICATING GATE OXIDE

BACKGROUND OF THE INVENTION

1. Field of the Invention

The invention relates in general to a method of fabricating a semiconductor integrated circuit. More particularly, this invention relates to a method of fabricating gate oxide layer.

2. Description of the Related Art

In the intensively developed semiconductor industry, how to reduce the device and increase the integration has become a leading trench in fabrication technique. When the dimension of the device is shrunk, the integration increases, the size of the device isolation has to be reduced consequently. The technique for fabricating the device isolation thus becomes more and more difficult. Local oxidation (LOCOS) is a common technique for fabricating a field oxide layer as the device isolation. However, due to the formation of a bird's beak, a leakage current is often caused, or even a white spot of image is formed. To apply this technique to form an isolation structure with a further reduce size thus becomes very difficult.

Thus, other techniques such as shallow trench isolation (STI) have been developed and widely applied. The shallow trench isolation has been intensively used in the sub-half micron integrated circuit.

The conventional method for fabricating a shallow trench isolation includes forming a pad oxide layer and a silicon nitride hard mask layer on a substrate. Using photolithography and etching process, a trench is formed in the substrate. Substrate around the trench is defined as an active region to provide formation of various active devices in the subsequent process.

A liner oxide layer is formed on a surface of the trench using thermal oxidation. The trench is then filled with a silicon oxide layer formed by chemical vapor deposition. The silicon oxide layer over the hard mask layer is then removed by chemical mechanical polishing. The silicon nitride hard mask layer and the pad oxide layer then removed to form the shallow trench isolation. Typically, hot phosphoric acid is used to remove the silicon nitride, and hydrogen fluoride is used to remove the pad oxide layer.

In the conventional process for fabricating the shallow trench isolation, an isotropic etching step is performed to remove the pad oxide layer and the hard mask layer. During the isotropic etching step, it is very easy to form a recess of the substrate at the top edge corner of the trench. As a result, a gate oxide layer formed subsequently has a thinner thickness around the shallow trench isolation. The thinner thickness may cause a parasitic device conductance, that is, the hump effect. In the subsequently process for forming a polysilicon layer as the gate, the top edge corner of the trench is covered by the gate to cause a large intensified field. A lower threshold voltage is resulted, and the sub-threshold leakage is increased. As the integrated circuit is fabricated with a smaller and smaller size, the local intensified field has a more and more serious effect on the sub-threshold leakage. Eventually, a gate oxide layer breakdown may be resulted.

SUMMARY OF THE INVENTION

The method provides a method of fabricating a gate oxide layer without reducing the active region. A hard mask layer is formed on a substrate. The hard mask layer and the substrate are patterned to form a trench in the substrate. A portion of the hard mask layer is removed to expose the substrate around the trench, that is, the substrate at a top edge corner of the trench is exposed. An insulation layer is formed to fill the trench over the exposed substrate and the remaining hard mask layer. The insulation layer over the surface level of the hard mask layer is removed. The remaining hard mask layer is removed to expose the substrate, while the substrate at the top edge corner of the trench is still covered with the insulation layer. An ion implantation step is performed on the exposed substrate to reduce the oxidation rate. The insulation layer over the surface level of the substrate is then removed to expose the substrate at the top edge corner of the trench. A gate is then formed on the substrate with a thicker thickness around the trench.

According to the invention, the ion implantation performed on the substrate provides a slower oxidation rate of the substrate. The substrate around the trench being covered with the insulation layer thus has an oxidation rate faster than the other position. As a result, the gate oxide layer has a thicker thickness around the trench, and a thinner thickness away from the trench. The problems such as parasitic device conductance, that is, the hump effect can be resolved.

In addition, the ion implantation is performed during the fabrication process of the shallow trench isolation with the insulation layer as a mask. That is, the ion implantation step is a self-aligned implantation step without forming additional masks. That is, the problems of the conventional method can be resolved by the invention without introducing any additional masks.

Both the foregoing general description and the following detailed description are exemplary and explanatory only and are not restrictive of the invention, as claimed.

DESCRIPTION OF THE PREFERRED EMBODIMENTS

FIG. 1A to FIG. 1G are cross sectional views of a gate oxide layer in different fabrication steps.

Figure 1A:
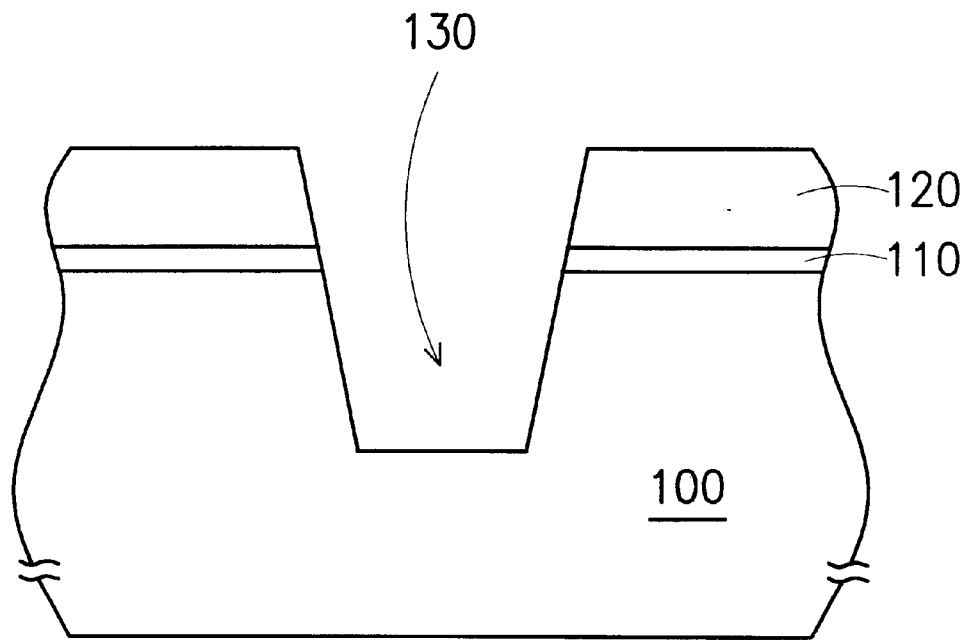
FIG. 1A to FIG. 1G shows the fabrication process of a gate oxide layer according to the invention.

In FIG. 1A, a substrate such as a silicon substrate 100 is provided. A pad oxide layer 110 is formed on the substrate 100 by, for example, thermal oxidation, to protect the substrate surface in the subsequent process. A hard mask layer 120 is formed on the pad oxide layer 110, for example, by chemical vapor deposition, with a thickness of about 2000 angstroms. The material of the hard mask layer 120 includes silicon nitride. Using photolithography and etching technique, the hard mask layer 120, the pad oxide layer 110 and the substrate 100 are patterned to form a trench 130 in the substrate 100. The etching technique includes a plasma etching, for example.

Figure 1B:
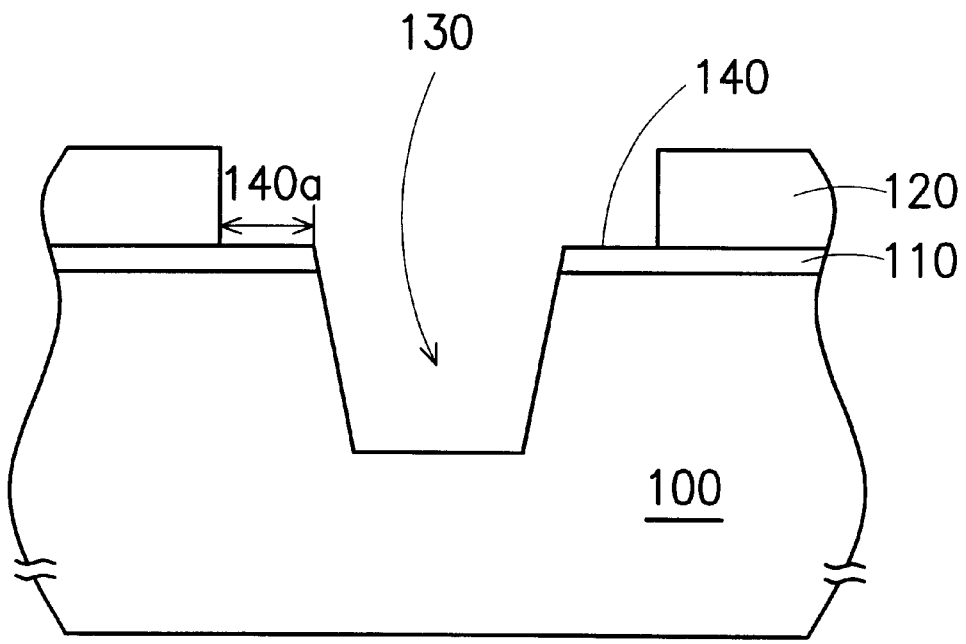

In FIG. 1B, a so-called "pull back" process is performed. A portion of the patterned hard mask layer 120 is removed to expose a portion of pad oxide layer 110 at a top edge corner region 140 of the trench 130. The exposed pad oxide layer denoted as 140 has a width of about 200 angstroms. The removal process includes an isotropic etching step using hot phosphoric acid.

Figure 1C:
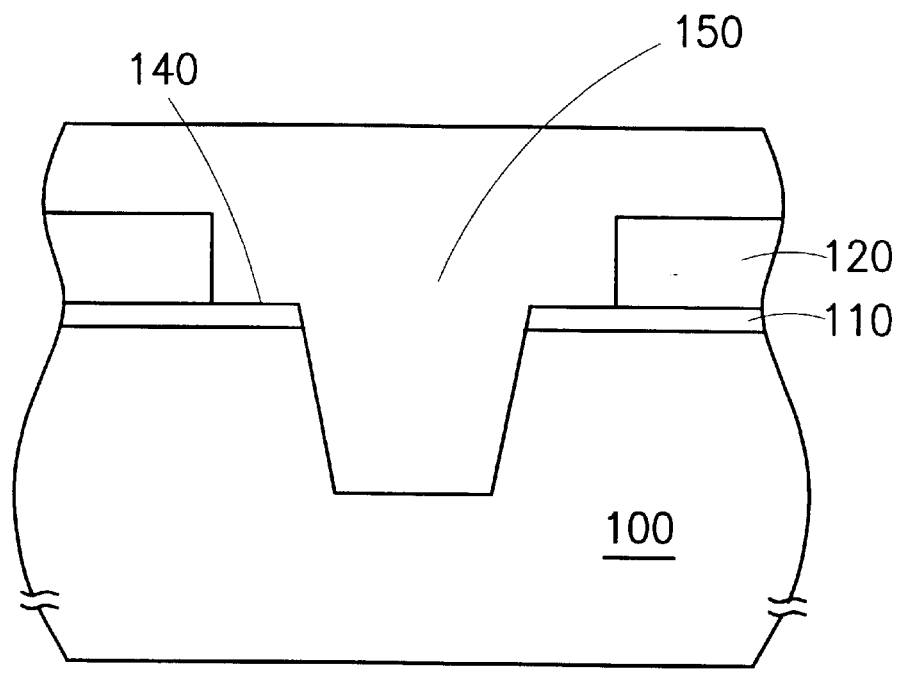

In FIG. 1C, an insulation layer 150 is formed to fill the trench 130, and overflow above the exposed pad oxide layer 110 at the top edge corner region 140 and the patterned hard mask layer 120. The insulation layer 150 includes an oxide layer using chemical vapor deposition with the tetra-ethyl-ortho-silicate (TEOS) and $O_3$ as reaction gases. A densification step is further performed to further densify the insulation layer 150.

Figure 1D:
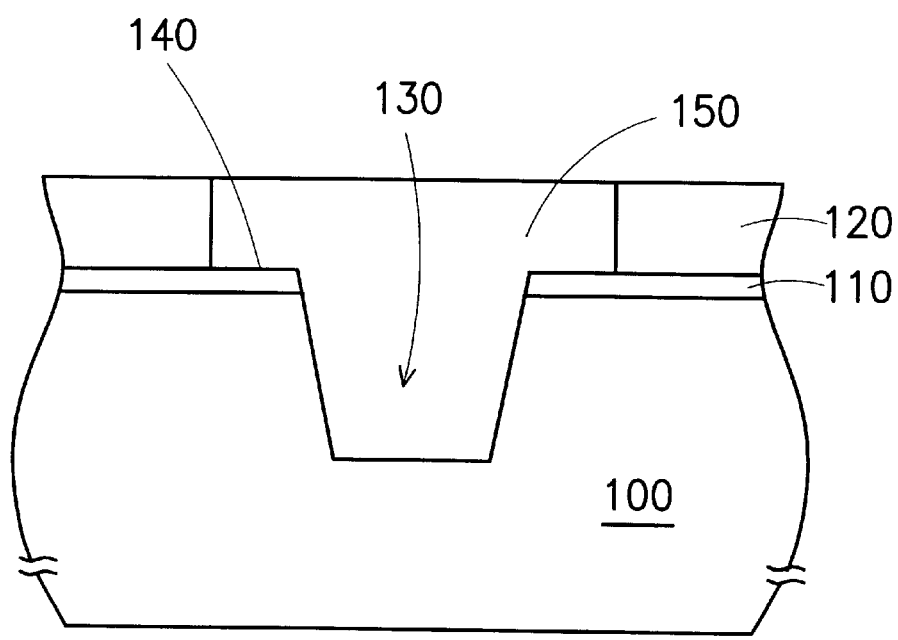

In FIG. 1D, the insulation layer 150 over the surface level of the patterned hard mask layer 120 is removed to expose the pattern hard mask layer 120. The removal method includes chemical mechanical polishing (CMP). In this step, the patterned hard mask layer 120 is used as a polishing stop.

Figure 1E:
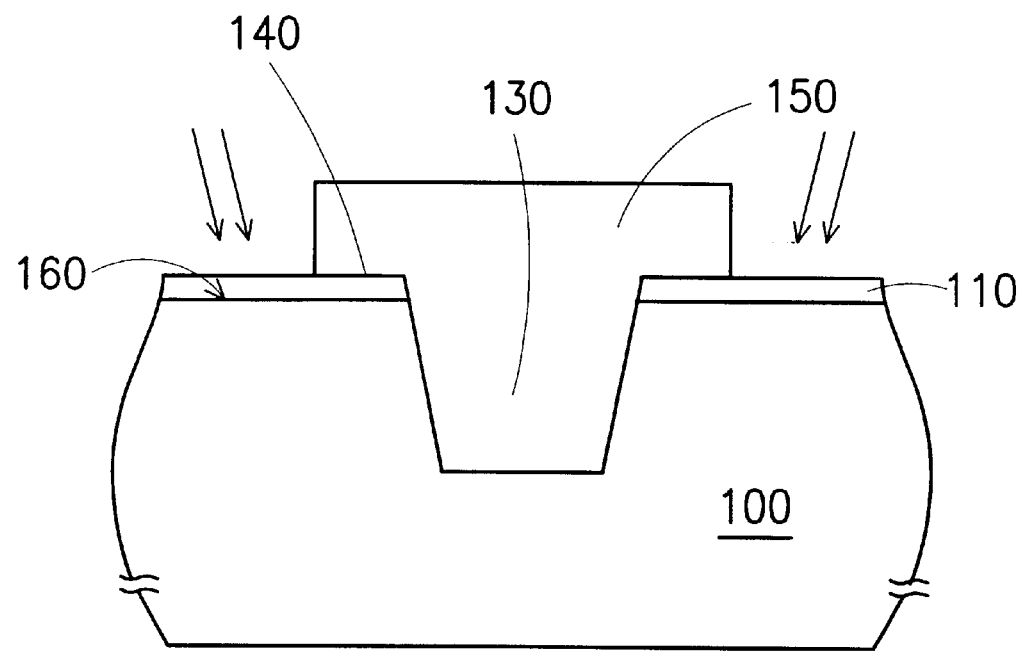

In FIG. 1E, the patterned hard mask layer 120 is removed to expose the underlying pad oxide layer 110. An isotropic etching step including a wet etching step is performed, for example. As shown in FIG. 1E, meanwhile, the pad oxide layer 110 at the region 140 around the trench 130 is still covered with the insulation layer 150. A self-aligned ion implantation is performed on the exposed pad oxide layer 110 with the insulation layer 150 as a mask. A doped region 160 is thus formed on a surface portion of the substrate 100. The doped region 150 has a reduced oxidation rate compared to undoped substrate 100. The implanted ions include nitrogen, and the implantation energy is controlled at about 5 KeV to about 10 KeV, while the dosage is about $5 \times 10^{14}$ ions/cm$^2$ to about $1 \times 10^{15}$ ions/cm$^2$.

Figure 1F:
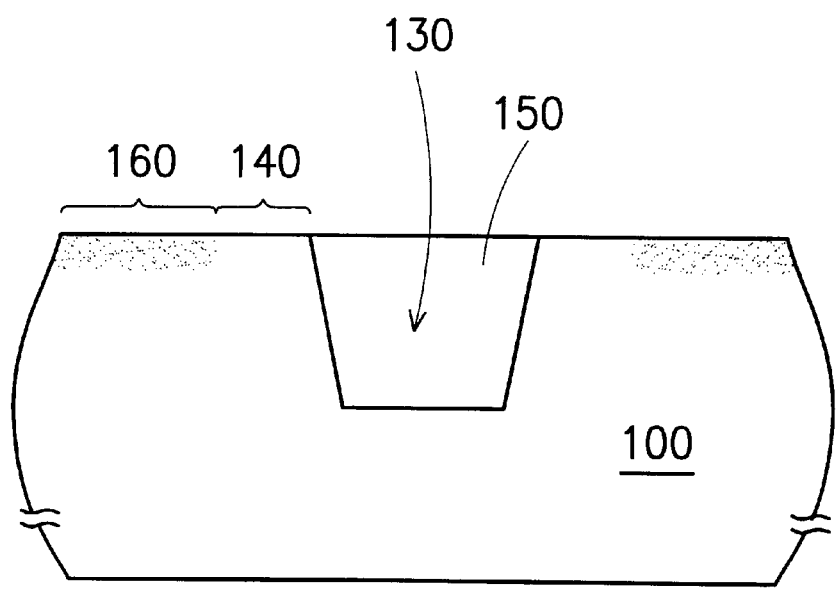

In FIG. 1F, the insulation layer 150 over the surface level of the substrate 100 and the pad oxide layer 110 are removed. As shown in FIG. 1F, as the substrate 100 at the top edge corner of the trench is undoped, it thus has a faster oxidation rate than the doped substrate 100. The removal step of the insulation layer 150 and the pad oxide layer 110 includes an isotropic etching such as a wet etching step using the hydrogen fluoride solution as the etchant.

Figure 1G:
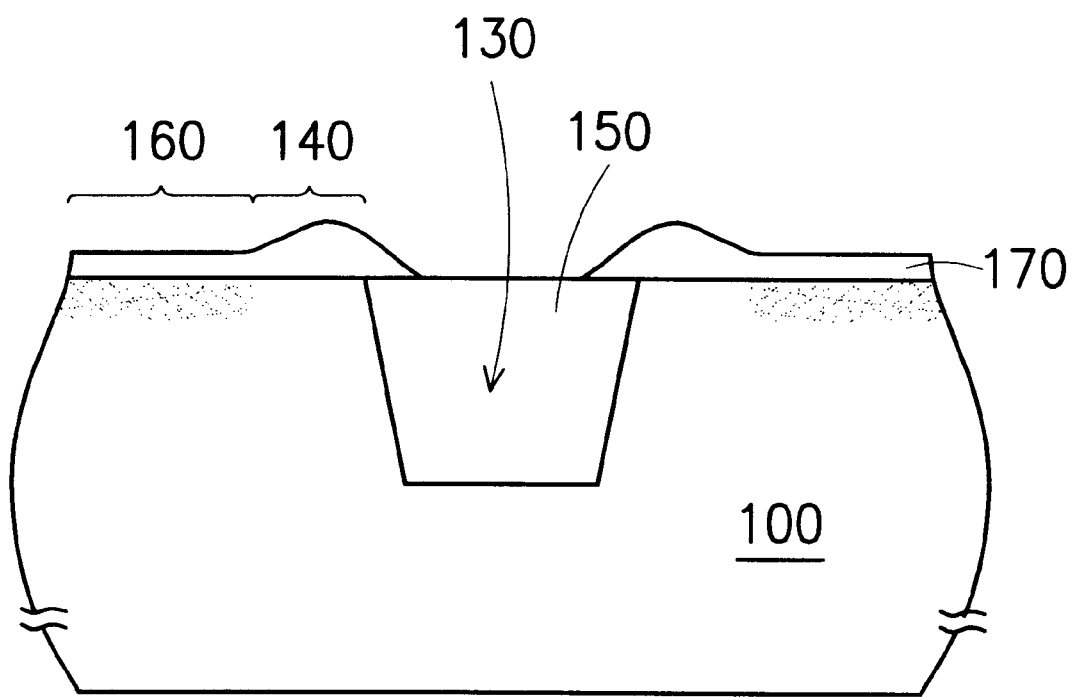

In FIG. 1G, a gate oxide layer 170 is formed on the substrate 100. As shown in FIG. 1G, the substrate 100 at the region 140 is undoped, so that the oxidation rate is faster than other places. As a result, at the top corner edge region 140, the gate oxide layer 170 is thicker than on other region 160.

In the above method, the insulation layer 150 extends over the substrate around the trench to be used as a mask for a subsequent ion implantation step. When the nitrogen is implanted to the substrate, this particular region is protected and covered without being doped. As a result, the oxidation rate of this region is faster than other region of the substrate. A gate oxide layer formed subsequently can thus have different thickness in different regions. As the implantation is self-aligned, no additional photomask is required without increasing additional fabrication cost. Furthermore, the pull back process does not reduce the active region and can be applied to system on chip.

The problems such as the hump effect occurring in the conventional method can be effect resolved by the invention. The parasitic device conductance can thus be eliminated by the invention.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a gate oxide layer, comprising:
   providing a substrate;
   forming a pad oxide layer on the substrate;
   forming a hard mask layer on the pad oxide layer;
   patterning and etching the hard mask layer, the pad oxide layer and the substrate to form a trench in the substrate;
   removing a portion of the hard mask layer to expose a portion of the pad oxide layer at a top edge corner of the trench;
   forming an insulation layer to fill the trench and cover the exposed pad oxide layer at the top edge corner of the trench and the hard mask layer;
   removing the insulation layer over a surface level of the hard mask layer until the hard mask layer is exposed;
   removing the hard mask layer;
   performing a self-aligned doping step on the substrate underlying the exposed pad oxide layer to reduce the oxidation rate thereof;
   removing the insulation layer over a surface level of the pad oxide layer, and removing the pad oxide layer until the substrate is exposed; and
   forming a gate oxide layer on the substrate with a thickness thicker at the top edge corner of the trench.

2. The method according to claim 1, wherein the step of self-aligned doping performed on the substrate includes a step of ion implantation.

3. The method according to claim 2, wherein nitrogen is used in the step of ion implantation.

4. The method according to claim 2, wherein the step of ion implantation includes performing this step with an implantation energy of about 5 KeV to about 10 KeV.

5. The method according to claim 2, wherein the step of ion implantation includes performing this step with a dosage of about $5 \times 10^{14}$ ions/cm$^2$ to about $1 \times 10^{15}$ ions/cm$^2$.

6. The method according to claim 1, wherein the step of removing the insulation layer over the hard mask layer includes a step of chemical mechanical polishing using the hard mask layer as a polishing stop.

7. The method according to claim 1, wherein the step of removing the hard mask layer to expose the portion of the pad oxide layer at the top edge corner of the trench includes an isotropic etching step.

8. The method according to claim 1, wherein the step of removing the hard mask layer to expose the portion of the pad oxide layer at the top edge corner of the trench includes a wet etching step.

9. The method according to claim 1, wherein the step of forming the hard mask layer includes a step of forming a silicon nitride layer.

10. The method according to claim 1, wherein the step of removing the hard mask layer to expose the other portion of the pad oxide layer uses hot phosphoric acid.

11. The method according to claim 1, wherein the step of forming the insulation layer includes a step of chemical vapor deposition.

12. The method according to claim 1, wherein the step of forming the insulation layer includes a chemical vapor deposition step using tetra-ethyl-ortho-silicate and $O_3$ as the reaction gases.

13. A method of fabricating a gate oxide layer, comprising:
   providing a substrate with a trench, the substrate comprising an active region isolated by the trench and covered by a hard mask layer, while the substrate around a top corner of the trench is exposed;
   forming an insulation layer to at least fill the trench and cover the substrate around the top corner of the trench, but exposing the hard mask layer;
   removing the hard mask layer over the substrate;
   implanting ions into the exposed substrate, so that the exposed portion of the substrate has an oxidation rate slower than that of the substrate covered with the insulation layer;

removing a portion of the insulation layer down to a surface level of the substrate and exposing the substrate at the top corner edge of the trench; and performing an oxidation step on the substrate to form a gate oxide layer, wherein the gate oxide layer on the substrate around the top corner of the trench is thicker than the gate oxide layer on the substrate at other positions.

14. The method according to claim 13, wherein nitrogen is used in the step of the ion implantation.

15. The method according to claim 14, wherein the step of ion implantation includes performing this step with an implantation energy of about 5 KeV to about 10 KeV.

16. The method according to claim 14, wherein the step of ion implantation includes performing this step with a dosage of about $5 \times 10^{14}$ ions/cm$^2$ to about $1 \times 10^{15}$ ions/cm$^2$.

17. The method according to claim 13, wherein the step of forming the insulation layer includes a step of chemical vapor deposition.

18. The method according to claim 17, wherein the step of forming the insulation layer includes a chemical vapor deposition step using tetra-ethyl-ortho-silicate and $O_3$ as the reaction gases.

19. The method according to claim 13, wherein the step of forming the gate oxide layer includes a step of thermal oxidation.

* * * * *